(12) United States Patent
Fan

(10) Patent No.: US 11,164,900 B2
(45) Date of Patent: Nov. 2, 2021

(54) IMAGE SENSOR CHIP-SCALE-PACKAGE

(71) Applicant: OmniVision Technologies, Inc., Santa Clara, CA (US)

(72) Inventor: Chun-Sheng Fan, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/154,544

(22) Filed: Oct. 8, 2018

(65) Prior Publication Data
US 2020/0111829 A1 Apr. 9, 2020

(51) Int. Cl.
H01L 31/0203 (2014.01)
H01L 27/146 (2006.01)
H01L 23/00 (2006.01)

(52) U.S. Cl.
CPC ........ H01L 27/14618 (2013.01); H01L 24/73 (2013.01); H01L 27/1463 (2013.01); H01L 27/14632 (2013.01); H01L 27/14636 (2013.01); H01L 27/14687 (2013.01); *H01L 2224/02371* (2013.01)

(58) Field of Classification Search
None
See application file for complete search history.

(56) References Cited

U.S. PATENT DOCUMENTS 6,989,589 B2 * 1/2006 Hammadou ...... H01L 27/11803
257/258
8,269,300 B2 9/2012 Chien et al.
9,450,004 B2 9/2016 Tu et al.
9,966,401 B2 * 5/2018 Jun ................... H01L 27/14618
10,243,014 B2 3/2019 Lin et al.
2004/0227235 A1 * 11/2004 Hashimoto ......... H01L 25/0657
257/734

(Continued)

FOREIGN PATENT DOCUMENTS

EP 2375447 B1 10/2011
TW 201135922 A 10/2011

(Continued)

OTHER PUBLICATIONS

Taiwan Patent Application No. 108136088, 1$^{st}$ Office Action in dated Oct. 20, 2020, 12 pages.

(Continued)

Primary Examiner — Hung K Vu
(74) Attorney, Agent, or Firm — Lathrop GPM LLP

(57) ABSTRACT

An image sensor chip-scale package includes a pixel array, a cover glass covering the pixel array, a dam, and an adhesive layer. The pixel array is embedded in a substrate top-surface of a semiconductor substrate. The semiconductor substrate includes a plurality of conductive pads in a peripheral region of the semiconductor substrate surrounding the pixel array. The dam at least partially surrounds the pixel array and is located (i) between the cover glass and the semiconductor substrate, and (ii) on a region of the substrate top-surface between the pixel array and the plurality of conductive pads. The adhesive layer is (i) located between the cover glass and the semiconductor substrate, (ii) at least partially surrounding the dam, and (iii) configured to adhere the cover glass to the semiconductor substrate.

11 Claims, 9 Drawing Sheets

(56) References Cited

U.S. PATENT DOCUMENTS

| | | | |
|---|---|---|---|
| 2009/0256222 A1* | 10/2009 | Hsu | H01L 27/14618 |
| | | | 257/432 |
| 2011/0241147 A1 | 10/2011 | Tu et al. | |
| 2011/0291215 A1 | 12/2011 | Tu et al. | |
| 2012/0068288 A1 | 3/2012 | Hsin et al. | |
| 2013/0221470 A1* | 8/2013 | Kinsman | H01L 27/14618 |
| | | | 257/434 |
| 2016/0148966 A1 | 5/2016 | Lin et al. | |
| 2017/0345864 A1* | 11/2017 | Kinsman | H01L 23/49838 |
| 2018/0012853 A1 | 1/2018 | Lin et al. | |
| 2018/0017741 A1 | 1/2018 | Ho et al. | |
| 2018/0019274 A1* | 1/2018 | Yang | H01L 27/14618 |

FOREIGN PATENT DOCUMENTS

| | | | |
|---|---|---|---|
| TW | 201135923 A | 10/2011 | |
| TW | 201143039 A | 12/2011 | |
| TW | 201214682 A | 4/2012 | |
| TW | M550909 U | 10/2017 | |

OTHER PUBLICATIONS

Taiwan Patent Application No. 108136088, English Translation of $1^{st}$ Office Action in dated Oct. 20, 2020, 7 pages.

Taiwan Patent Application No. 108136088, 2nd Office Action dated Jun. 10, 2021, 10 pages.

Taiwan Patent Application No. 108136088, English Translation of 2nd Office Action Jun. 10, 2021, 6 pages.

* cited by examiner

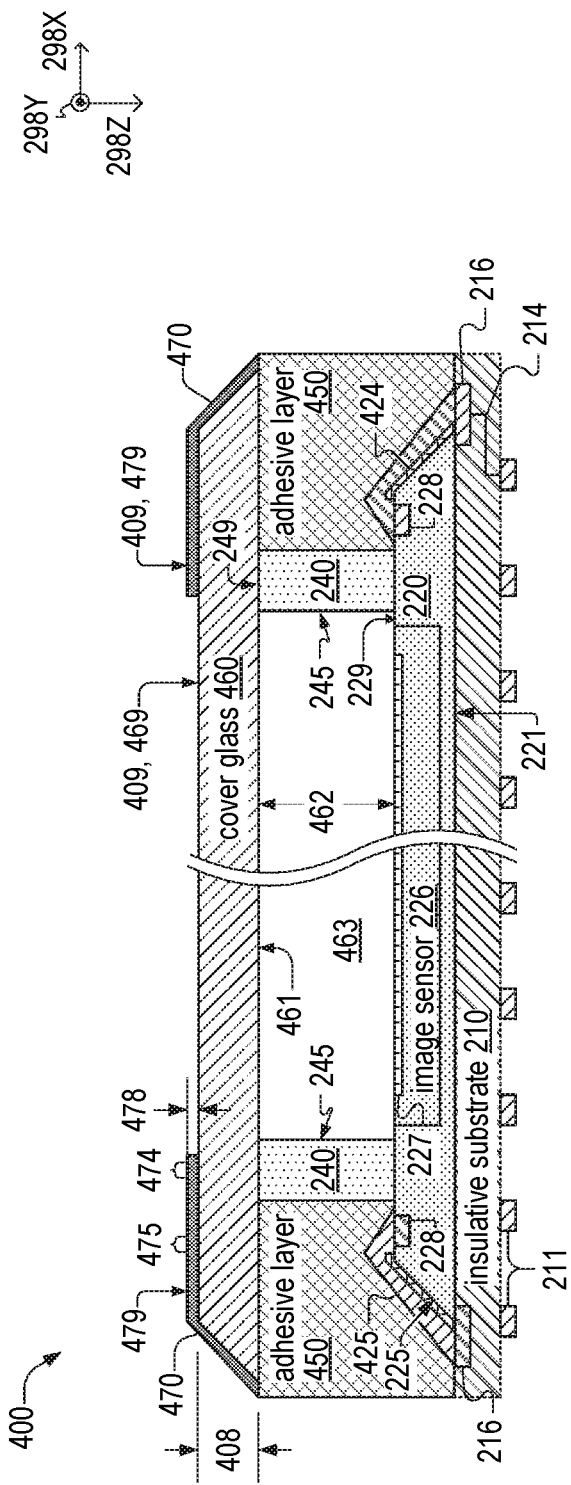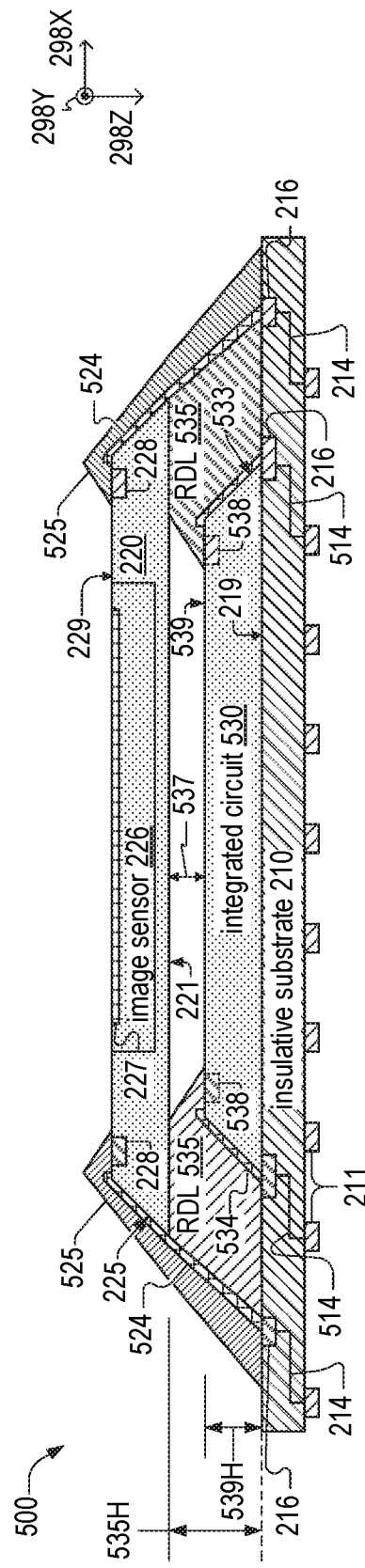

IMAGE SENSOR CHIP-SCALE-PACKAGE

BACKGROUND

Camera modules in consumer devices such as stand-alone digital cameras, mobile devices, automotive components, and medical devices often include a lens assembly and an image sensor. The quality of images captured by the camera module depends in part on proper alignment of the lens assembly to the image sensor.

SUMMARY OF THE EMBODIMENTS

Disclosed herein are embodiments directed toward facilitating accurate and reproducible alignment of the lens assembly to the image sensor.

In a first aspect, an image sensor chip-scale package includes a pixel array, a cover glass covering the pixel array, a dam, and an adhesive layer. The pixel array is embedded in a substrate top-surface of a semiconductor substrate. The semiconductor substrate includes a plurality of conductive pads in a peripheral region of the semiconductor substrate surrounding the pixel array. The dam at least partially surrounds the pixel array and is located (i) between the cover glass and the semiconductor substrate, and (ii) on a region of the substrate top-surface between the pixel array and the plurality of conductive pads. The adhesive layer is (i) located between the cover glass and the semiconductor substrate, (ii) at least partially surrounding the dam, and (iii) configured to adhere the cover glass to the semiconductor substrate.

In a second aspect, an image sensor chip-scale package includes an insulative substrate, an image sensor, an integrated circuit, and a first redistribution layer. The insulative substrate includes a first plurality of conductive vias therethrough. The integrated circuit is located between the insulative substrate and the image sensor and has a top surface at a first height above a top surface of the insulative substrate. The first redistribution layer (i) electrically connects the integrated circuit to each of the first plurality of conductive vias, and (ii) spans a distance between the image sensor and the top surface of the insulative substrate. The distance exceeds the first height.

In a third aspect, a method for fabricating an image sensor chip-scale package includes bonding, with an adhesive, a cover glass to a semiconductor substrate. The adhesive occupies an inter-dam region surrounding a first pixel array embedded in a substrate top-surface of the semiconductor substrate. The inter-dam region is bounded at least in part by (i) a dam at least partially surrounding the first pixel array, (ii) an adjacent dam least partially surrounding a respective pixel array adjacent to the first pixel array, and (iii) an inter-dam surface of the substrate top-surface.

BRIEF DESCRIPTION OF THE FIGURES

FIG. 4 is a schematic cross-sectional view of a first image-sensor chip-scale package, which is an embodiment of image-sensor package of FIG. 1.

FIG. 5 is a schematic cross-sectional view of a second image-sensor chip-scale package, which is an embodiment of image-sensor package of FIG. 1.

DETAILED DESCRIPTION OF THE EMBODIMENTS

Figure 1:
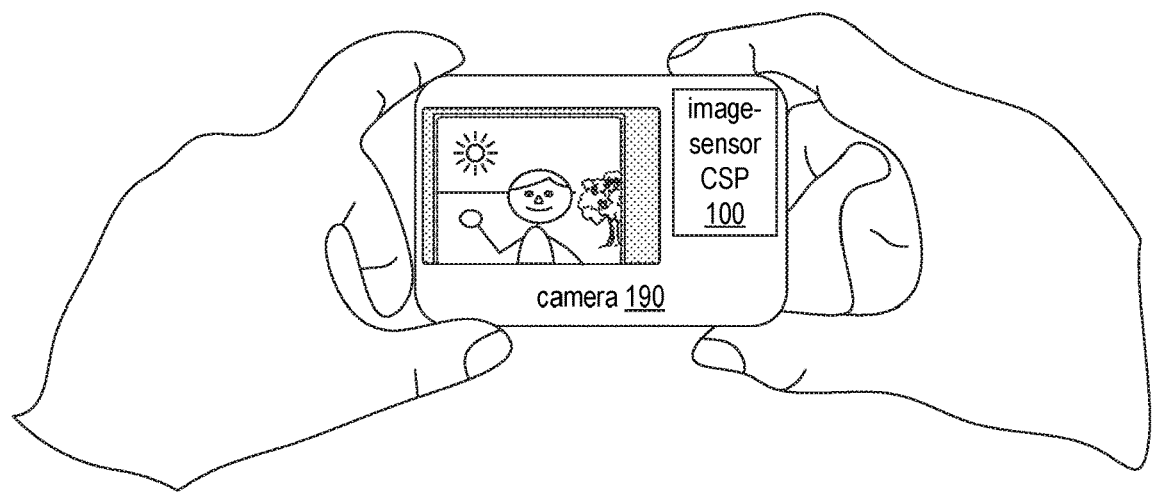
FIG. 1 depicts a camera that includes an embodiment of an image-sensor package.

FIG. 1 depicts a camera 190 imaging a scene. Camera 190 includes an image-sensor chip-scale package 100. Herein, "image-sensor chip-scale package" is abridged to "CSP" and for sake of brevity.

Figure 2:
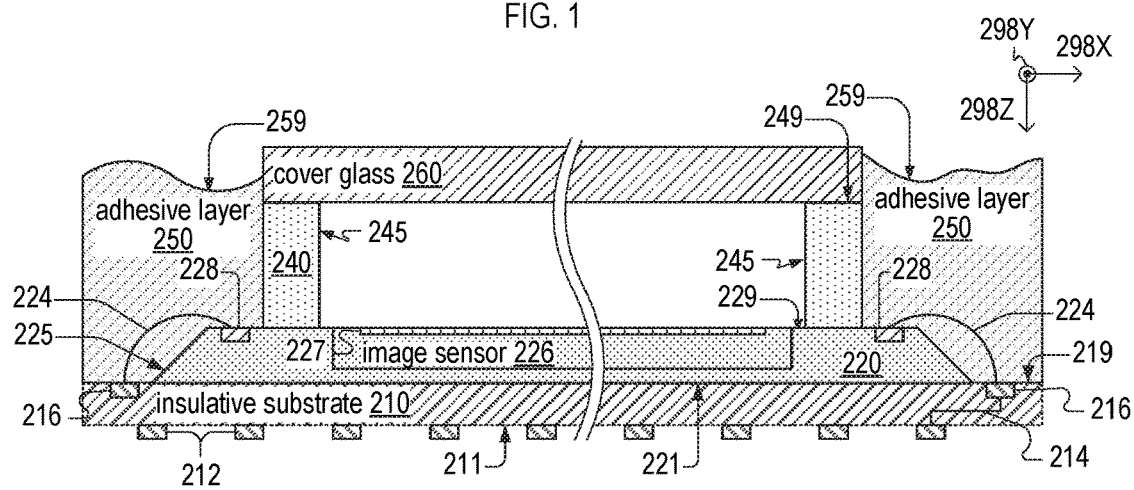
FIG. 2 is a schematic cross-sectional view of an image-sensor package, which is an embodiment of the image-sensor package of FIG. 1.
Figure 3:
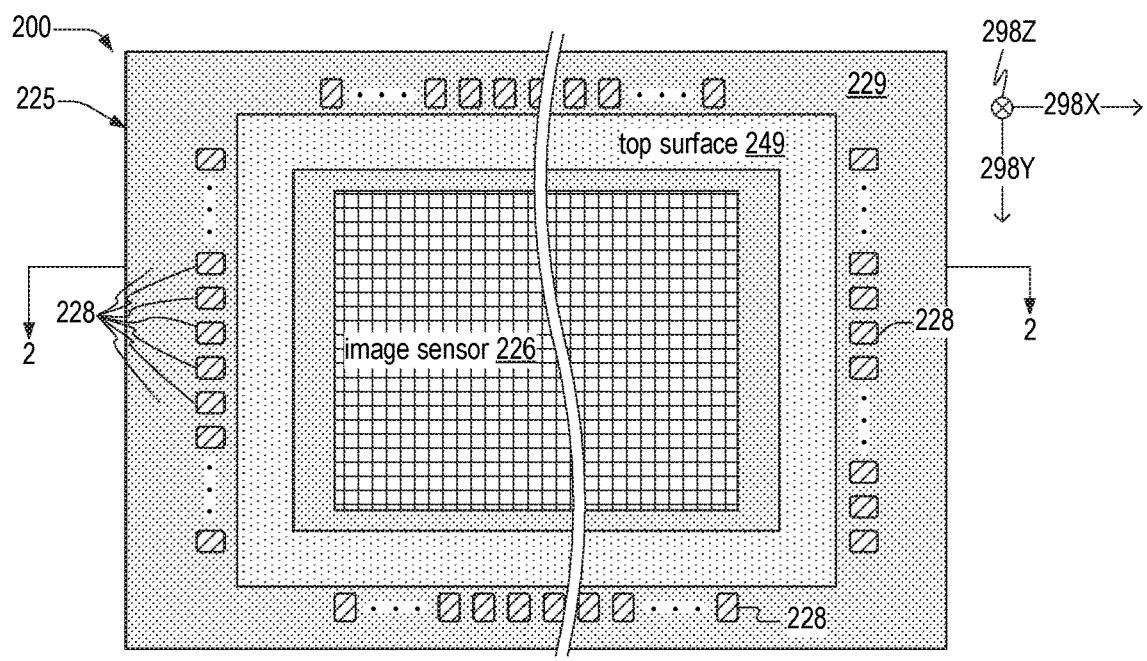
FIG. 3 is a plan-view schematic illustrating part of the image-sensor package of FIG. 2, in an embodiment.

FIG. 2 is a schematic cross-sectional view of an image-sensor chip-scale package 200, which is an embodiment of CSP 100. The cross-sectional plane of schematic of FIG. 2 is parallel to a plane that includes orthogonal directions 298X and 298Z, which are each orthogonal to a direction 298Y. CSP 200 includes a semiconductor substrate 220, a dam 240, an adhesive layer 250, and a cover glass 260. FIG. 3 is a plan-view schematic of semiconductor substrate 220 and dam 240. FIGS. 2 and 3 are best viewed together in the following description. The cross-sectional view of FIG. 2 is, for example, in cross-sectional plane 2 of FIG. 3.

Semiconductor substrate 220 has a bottom surface 221, a side surface 225, a top surface 229, and a pixel array 227 embedded therein. Pixel array 227 is part of an image sensor 226. Semiconductor substrate 220 includes a plurality of conductive pads 228 in a peripheral region of semiconductor substrate 220 surrounding pixel array 227. Each conductive pad 228 is electrically connected to image sensor 226, and may be, but need not be, exposed on top surface 229, which may include surfaces of conductive pads 228. Conductive pads 228 may be part of image sensor 226.

Dam 240 at least partially surrounds pixel array 227 and is located between cover glass 260 and semiconductor substrate 220, on a region of top surface 229 between pixel array 227 and conductive pads 228. Cover glass 260 covers pixel array 227 and is above a top surface 249 of dam 240.

CSP 200 may also include an insulative substrate 210, which has a bottom surface 211 and a top surface 219. Insulative substrate 210 includes a plurality of conductive pads 216 each electrically connected to a respective one of a plurality of bottom conductive pads 212, e.g., by a respective on of a plurality of conductive vias 214 through insulative substrate 210. Conductive pads 216 and 212 may be exposed on top surface 219 and bottom surface 211, respectively. Each conductive pad 228 is electrically connected to at least one of conductive pads 216 and bottom conductive pads 212 by a respective wire bond 224. Any one conductive via 214 may be a through via, a blind via, or a buried via.

Insulative substrate 210 may include at least one material selected from the group of materials including, but not limited to, an oxide, a solder mask material, silicon carbide, silicon dioxide, silicon nitride, aluminum oxide, benzocyclobutene (BCB), a dielectric, a polyimide, a resin, and combinations thereof. Insulative substrate 210 may be a printed circuit board. Dam 240 may include at least one material selected from the group of materials including, but not limited to epoxy acrylate, oligomer, polymethylacrylate, acrylic, silica, polydimethylsiloxane, an epoxy resin, silicon dioxide, and any combination thereof. Semiconductor substrate 220 may include at least one material selected from the group of materials including, but not limited to silicon, germanium, and any combination thereof. Adhesive layer 250 may include at least one material selected from the group of materials including, but not limited to mercaptoester, acrylic, an epoxy, polyimide, and polydimethylsiloxane, and any combination thereof. Cover glass 260 includes at least one material selected from the group of materials including, but not limited to, aluminosilicate glass, alkali-free glass, borosilicate glass, quartz glass, and combinations thereof.

Adhesive layer 250 bonds cover glass 260 to semiconductor substrate 220 and, when applicable, insulative substrate 210. Adhesive layer 250 also protects wire bonds 224. Adhesive layer 250 may be formed of epoxy, and has a top surface 259. A disadvantage of adhesive layer 250 is that it shrinks upon curing, such that top surface 259 may have a non-uniform height above surface 229 and/or surface 219. A planar top surface of CSP 200 facilitates assembly of CSP 200 with a lens assembly that, for example, rests on top surface 259. For optimal image quality, the lens assembly must be aligned with CSP 200 such that its optical axis orthogonal to a plane of pixel array 227. Such alignment is impeded when top surface 259 has a non-uniform height.

FIG. 4 is a schematic cross-sectional view of an image-sensor chip-scale package 400, which is an embodiment of CSP 100. CSP 400 remedies the aforementioned problems of CSP 200. The cross-sectional plane of the schematic of FIG. 4 is parallel to a plane that includes orthogonal directions 298X and 298Z. CSP 400 includes semiconductor substrate 220, dam 240, an adhesive layer 450, and a cover glass 460. Candidate materials for adhesive layer 450 and cover glass 460 are the same as those for adhesive layer 250 and cover glass 260, respectively. CSP may also include insulative substrate 210 beneath semiconductor substrate 220.

Semiconductor substrate 220, dam 240, and cover glass 460 may form a cavity 463 above image sensor 226. The cavity may be formed by top surface 229 of semiconductor substrate 220, an interior side surface 245 of dam 240, and a cover glass bottom-surface 461 of cover glass 460. The cavity may have a minimum height corresponding to a minimum distance 462 between cover glass bottom-surface 461 and top surface 229. Minimum distance 462 may be greater than or equal to a height of dam 240. For example, minimum distance 462 may equal a sum of the height of dam 240 and a thickness of any adhesive, e.g. adhesive layer 450, between dam 240 and cover glass 460. Minimum distance 462 is, for example, between thirty and fifty micrometers.

Adhesive layer 450 is (i) located between cover glass 460 and semiconductor substrate 220, (ii) at least partially surrounds dam 240, and (iii) configured to adhere cover glass 460 to semiconductor substrate 220. Adhesive layer 450 may span between cover glass bottom-surface 461 and top-surface 229. When CSP 400 includes insulative substrate 210, adhesive layer 450 may span between cover glass bottom-surface 461 and top surface 219 of insulative substrate 210.

CSP 400 has a package top-surface 409. Package top-surface 409 includes respective regions located above pixel array 227, dam 240, and adhesive layer 450. Cover glass 460 has cover glass bottom-surface 461 and a top surface 469. Package top-surface 409 includes at least part of top surface 469. Package top-surface 409 has a height 408, with respect to cover glass bottom-surface 461, that is uniform to within three micrometers. Such uniformity facilitates alignment of the aforementioned lens assembly to pixel array 227. Package top-surface 409 may be the top-most surface of the image sensor chip-scale package.

CSP 400 may include an opaque mask 470 on cover-glass top-surface 469. Opaque mask 470 is above at least one of dam 240 and adhesive layer 450. For example, opaque mask 470 includes at least one of a region 474 and a region 475, which are directly above dam 240 and adhesive layer 450, respectively. Opaque mask 470 has a top surface 479. When CSP 400 includes opaque mask 470, package top-surface 409 includes part of top surface 479.

Materials constituting adhesive layer 450 may differ from materials constituting opaque mask 470. Opaque mask 470 may include at least one material selected from the group of materials including, but not limited to tungsten, molybdenum, a photoresist material, and any combination thereof. Opaque mask 470 has a thickness 478, which may be less than three micrometers.

CSP 400 may include a redistribution layer 425. Redistribution layer 425 includes a plurality of conductive segments each electrically connected to a respective conductive pad 228 and extending from substrate top-surface 229 toward bottom surface 221. When CSP 400 includes insulative substrate 210, each conductive segment of redistribution layer 425 may electrically connect a respective conductive pad 228 to a respective conductive pad 216.

CSP 400 may include an isolation layer 424 between side surface 225 and redistribution layer 425. Part of isolation layer 424 may be between top surface 229 and redistribution layer 425. Isolation layer 424 may include at least one material selected from the group of materials including, but not limited to a polyimide, silicon carbide, an oxide, and any combination thereof. Isolation layer 424 is for example formed via plasma-enhanced chemical vapor deposition.

FIG. 5 is a schematic cross-sectional view of an image-sensor chip-scale package 500, which is an embodiment of CSP 100 that includes an integrated circuit 535. CSP 500 remedies the aforementioned problems of CSP 200. The cross-sectional plane of schematic of FIG. 5 is parallel to a plane that includes orthogonal directions 298X and 298Z.

CSP 500 includes insulative substrate 210, image sensor 226, integrated circuit 530, and a redistribution layer 535. Integrated circuit 530 is between the insulative substrate 210 and the image sensor 226, and has a top surface 539 at a height 539H above a top surface of the insulative substrate. In addition to the plurality of conductive vias 214, insulative substrate 210 may include a plurality of conductive vias 514. Any one conductive via 514 may be a through via, a blind via, or a buried via. Integrated circuit 530 may include digital signal processor such as an image signal processor.

Redistribution layer 535 electrically connects integrated circuit 530 to each of the plurality of conductive vias 514 insulative substrate 210. For example, integrated circuit 530 may include a plurality of conductive pads 538, each of which is electrically connected to a respective conductive via 214 by redistribution layer 535. Redistribution layer 535 may electrically connect image sensor 226 to integrated circuit 530, for example, when integrated circuit 530 includes an image signal processor.

Redistribution layer 535 spans a distance 535H between the image sensor and top surface 539 of the insulative substrate. Distance 535H exceeds height 539H by a gap thickness 537 between surfaces 539 and 221. Gap thickness 537 is, for example, between five micrometers and twenty-five micrometers. Distance 535H may correspond to a thickness of redistribution layer 535 between top surface 219 of insulative substrate 210 and bottom surface 221 of semiconductor substrate 220.

CSP 500 may include a redistribution layer 525 that electrically connects image sensor 226 to each of the plurality of conductive vias 214. Redistribution layer 525 includes a plurality of conductive segments each electrically connected to a respective conductive pad 228 and extending from substrate top-surface 229 toward top surface 219 of insulative substrate 210. When CSP 500 includes insulative substrate 210, each conductive segment of redistribution layer 525 may electrically connect a respective conductive pad 228 to a respective conductive pad 216. At least part of redistribution layer 535 may be between insulative substrate 210 and redistribution layer 525.

CSP 500 may include an isolation layer 524 between redistribution layer 525 and semiconductor substrate 220. CSP 500 may include an isolation layer 534 between redistribution layer 535 and integrated circuit 530. Isolation layers 524 and 534 are similar to isolation layer 424. At least part of isolation layer 534 may be on a side surface 533 of integrated circuit 530.

Figure 6:
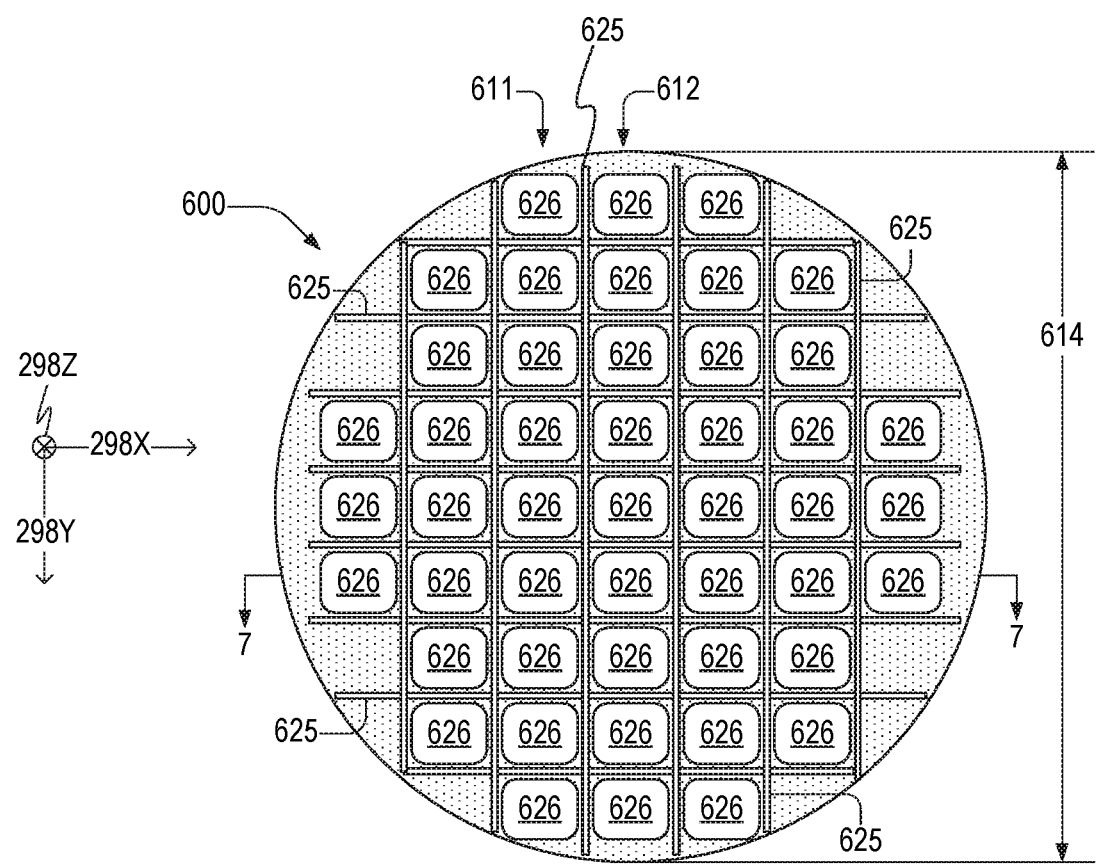
FIG. 6 is a top plan view of a device wafer, which includes a plurality of image sensors, in an embodiment.

FIG. 6 is a top plan view of a device wafer 600 in a plane parallel to the x-y plane, i.e., the plane spanned by directions 298X and 298Y. Device wafer 600 has a diameter 614, which may be between one hundred and five hundred millimeters, for example, three hundred millimeters or four-hundred fifty millimeters. Device wafer 600 includes a plurality of wafer-bound image sensors 626, and may be singulated such that each wafer-bound image sensor 626 becomes a respective image sensor 226. For clarity of illustration, FIG. 6 depicts device wafer 600 as including fewer than fifty image sensors 226. Device wafer 600 may include more or fewer image sensors 226 than depicted in FIG. 6.

Device wafer 600 includes a plurality of inter-device regions 625. Each inter-device region 625 is located between at least one pair of adjacent wafer-bound image sensors 626. For example, device wafer 600 includes a first column 611 of image sensors 626, a second column 612 of image sensors 626, and an inter-device region 625 therebetween.

Figure 7:
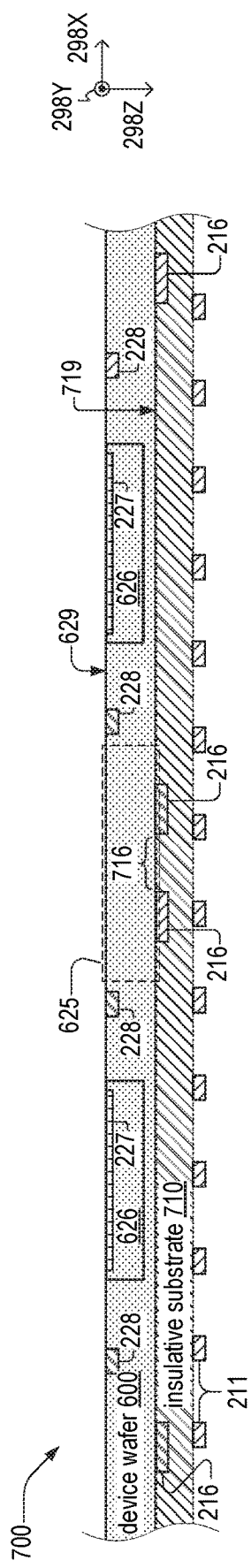
FIG. 7 is a cross-sectional view of a wafer assembly, which includes the device wafer of FIG. 6 on an insulative substrate, in an embodiment.

FIG. 7 is a cross-sectional view of a wafer assembly 700, which includes device wafer 600 on an insulative substrate 710. The cross-sectional view of FIG. 7 is, for example, in cross-sectional plane 7 of FIG. 6. Device wafer 600 includes a top surface 629; top surface 229 of semiconductor substrate 220 corresponds to a region of top surface 629. Substrate 710 may be singulated to yield a plurality of insulative substrates 210. Hence, substrate 710 includes a plurality of conductive pads 216. Insulative substrate 710 includes a top surface 719; top surface 219 of insulative substrate 210 corresponds to a region of top surface 719.

Device wafer 600 includes conductive pads 228, each of which is electrically connected to a wafer-bound image sensor 626. Each conductive pad 228 may be exposed on top surface 629, which may include surfaces of conductive pads 228. Insulative substrate 710 includes a plurality of conductive pads 216. Conductive pads 216 may be exposed on top surface 719.

Top surface 719 includes an inter-pad region 716 between adjacent conductive pads 216. Inter-pad region 716 may correspond to a region of top surface 719 that is directly beneath an inter-device region 625. Inter-pad region 716 may include parts of, but not all of, top surface 719, and not, for example, any surface of one or more conductive pads 216.

Figure 8:
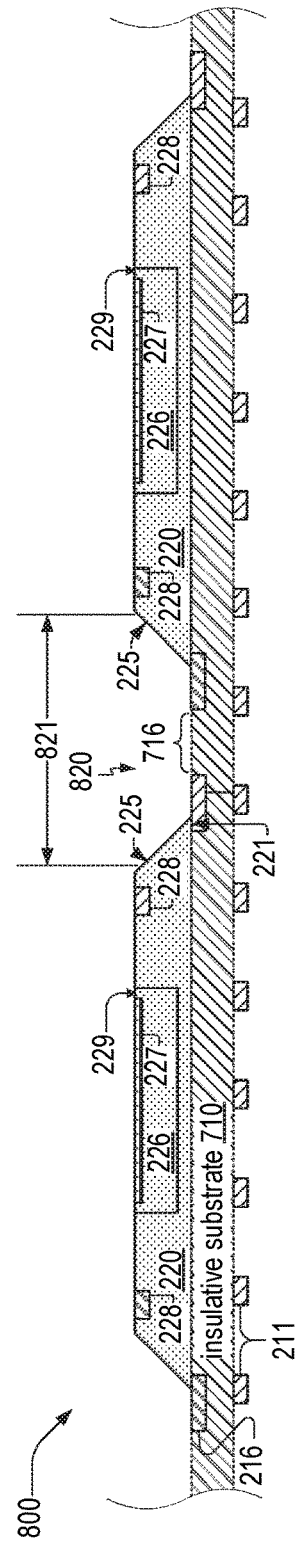
FIG. 8 is a cross-sectional view of the wafer assembly of FIG. 7 after removal of material from the device wafer of FIG. 6, in an embodiment.

FIG. 8 is a cross-sectional view of a wafer assembly 800. Wafer assembly 800 may result from exposing inter-pad regions 716 by removing material of device wafer 600 corresponding to inter-device regions 625. Such material removal may function to singulate device wafer 600 to yield a plurality of semiconductor substrates 220. Wafer assembly 800 includes a trench 820, which is bounded in part by opposing side surfaces 225 of adjacent semiconductor substrates 220 and top surface 719 corresponding to inter-pad region 716. Trench 820 has a width 821 determined by opposing side surfaces 225, that may vary in direction 298Z.

Figure 9:
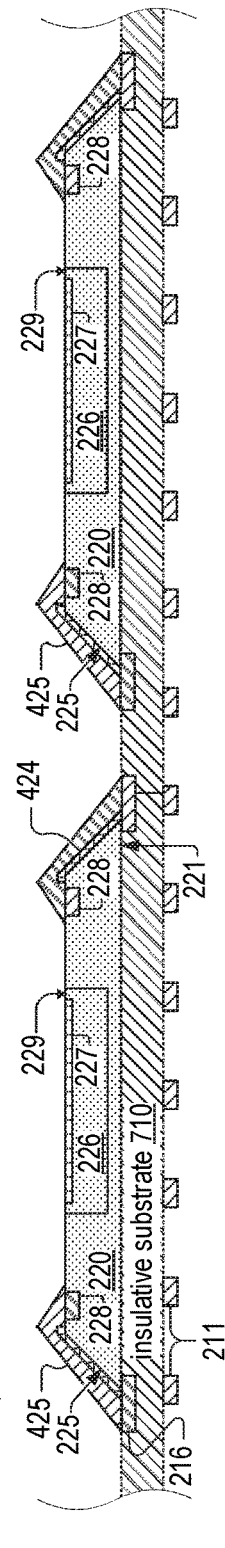
FIG. 9 is a cross-sectional view of the wafer assembly of FIG. 8 after addition of redistribution layers, in an embodiment.

FIG. 9 is a cross-sectional view of a wafer assembly 900, which is a modification of wafer assembly 800, wherein each semiconductor substrate 220 includes a respective redistribution layer 425 thereon. In wafer assembly 900, each semiconductor substrate 220 may also include a respective isolation layer such that isolation layer 424 is between side surface 225 and redistribution layer 425. As in CSP 400, FIG. 4, part of isolation layer 424 may be between top surface 229 and redistribution layer 425.

Figure 10:
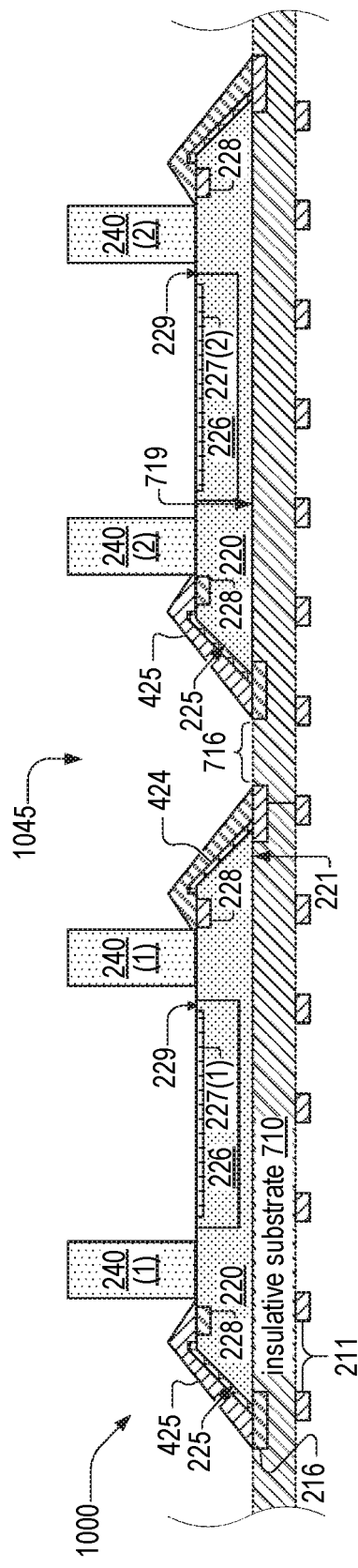
FIG. 10 is a cross-sectional view of the wafer assembly of FIG. 9 after addition of a dam surrounding each image sensor, in an embodiment.

FIG. 10 is a cross-sectional view of a wafer assembly 1000, which is wafer assembly 900 with the addition of, for each semiconductor substrate 220, a dam 240 at least partially surrounding each pixel array 227. For sake of clarity, the two pixel arrays 227 of wafer assembly 1000 illustrated in FIG. 10 are denoted by reference numerals 227(1) and 227(2), and the dams 240 surrounding pixel arrays 227(1,2) are denoted by respective reference numerals 240(1,2). Wafer assembly 1000 includes an inter-dam region 1045 bounded at least in part by dam 240(1), dam 240(2), and inter-pad region 716.

Figure 11:
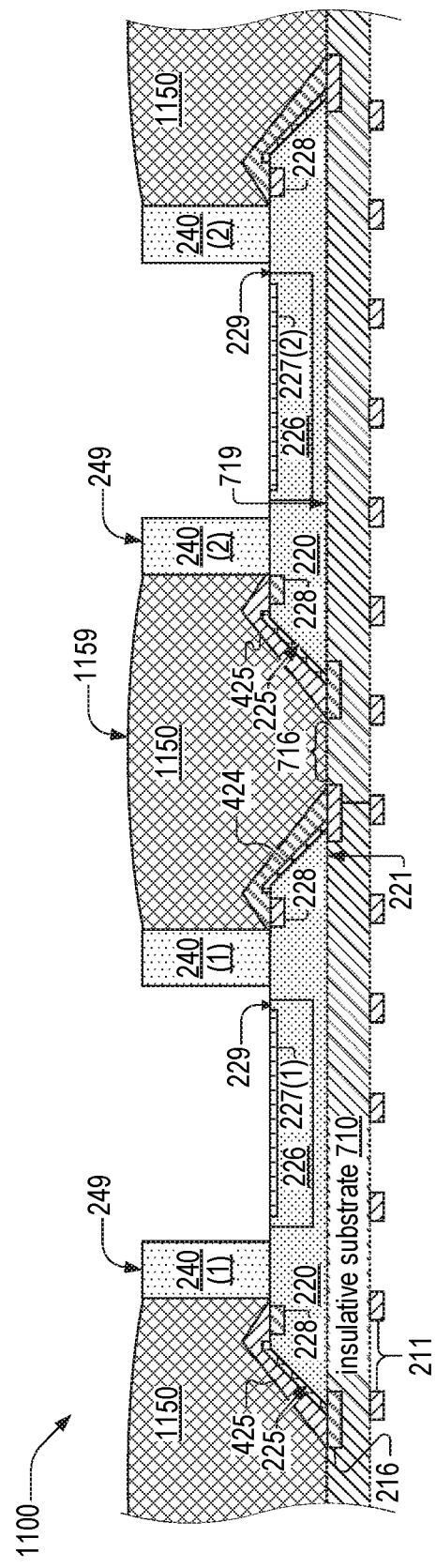
FIG. 11 is a cross-sectional view of a wafer assembly, which is the wafer assembly of FIG. 10 with an adhesive layer thereon between adjacent dams, in an embodiment.

FIG. 11 is a cross-sectional view of a wafer assembly 1100, which is wafer assembly 1000 with an adhesive layer 1150 in inter-dam region 1045. Candidate materials for adhesive layer 1150 are the same as those for adhesive layer 250. Adhesive layer 1150 has a top surface 1159, at least part of which may extend above top surface 249 of dam 240.

Figure 12:
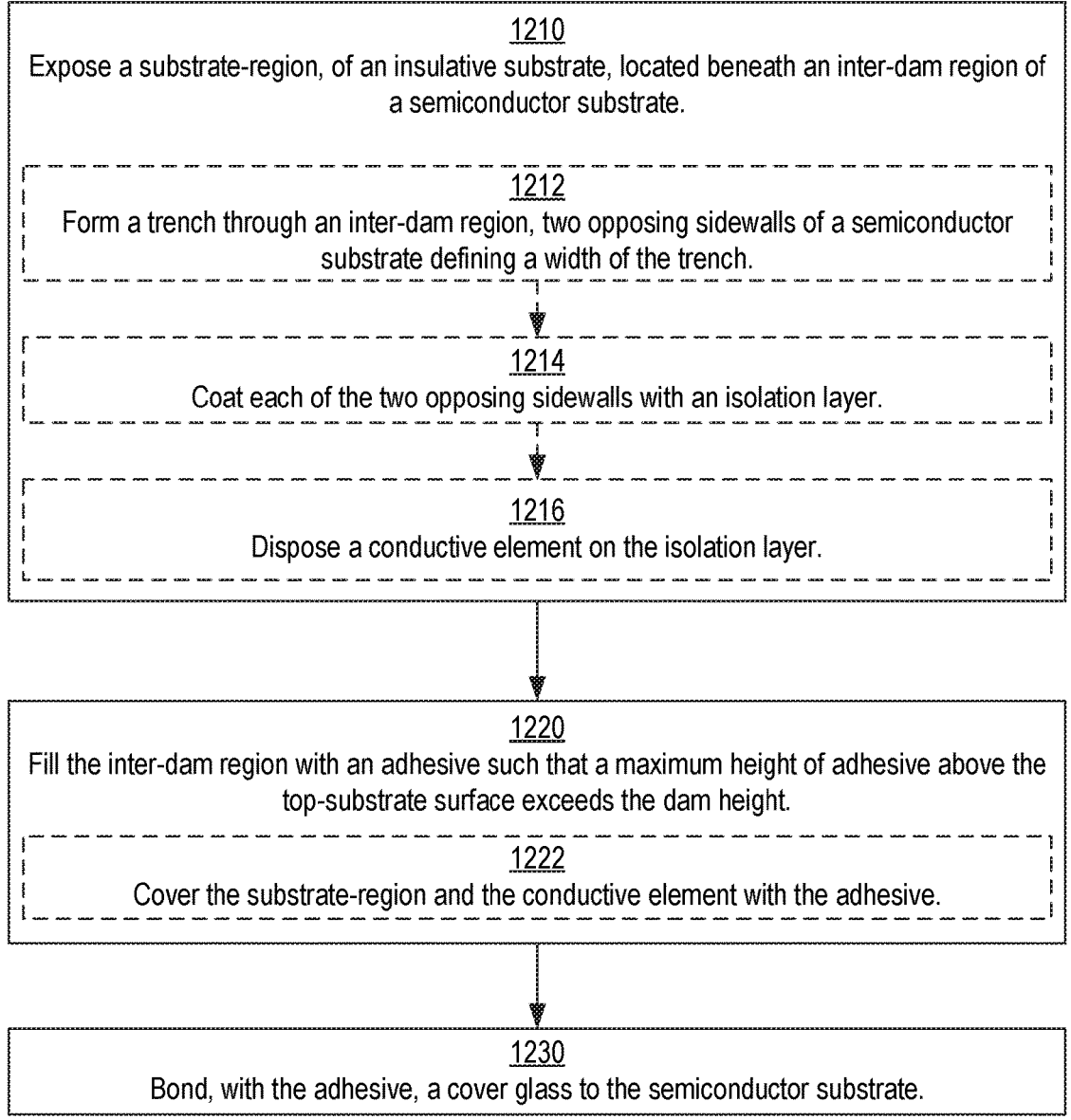
FIG. 12 is a flowchart illustrating a method for fabricating the image sensor chip-scale package of FIG. 4, in an embodiment.

FIG. 12 is a flowchart illustrating a method 1200 for fabricating an image sensor chip-scale package. Method 1200 includes step 1240, and may include at least one of steps 1210, 1220, and 1230.

Step 1230 includes bonding, with an adhesive, a cover glass to a semiconductor substrate. The adhesive occupies an inter-dam region surrounding a first pixel array embedded in a substrate top-surface of the semiconductor substrate. The inter-dam region is bounded at least in part by (i) a dam at least partially surrounding the first pixel array, (ii) a an adjacent dam least partially surrounding a respective pixel array adjacent to the first pixel array, and (iii) an inter-dam surface of the substrate top-surface. In an example of step 1230, a cover-glass wafer is bonded to wafer assembly 1100 via adhesive layer 1150.

Method 1200 may include step 1210 when the semiconductor substrate is attached to an insulative substrate thereebeneath and when the inter-dam region includes a conductive element electrically connected to the first pixel array. Step 1210 includes exposing a substrate-region, of the insulative substrate, located beneath the inter-dam surface. In an example of step 1210, inter-pad regions 716 of insulative substrate 710 are exposed to yield wafer assembly 800.

Step 1210 may include at least one of steps 1212, 1214, and 1216. Step 1212 includes forming a trench through the inter-dam region, two opposing sidewalls of the semiconductor substrate defining a width of the trench. In an example of step 1212, trench 820 of wafer assembly 700, FIG. 7, is formed through inter-dam region 716 to yield wafer assembly 800, FIG. 8.

Step 1214 includes coating each of the two opposing sidewalls with an isolation layer. In example of step 1214, side surfaces 225 of wafer assembly 800, FIG. 8, are coated with isolation layer 424 to yield wafer assembly 900, FIG. 9. Step 1216 includes disposing a conductive element on the isolation layer. In an example step 1216, redistribution layer 425 is disposed on isolation layer 424 of wafer assembly 900, FIG. 9.

When the dam and the adjacent dam each have a dam height above a substrate top-surface, method 1200 may include step 1220. Step 1220 includes filling the inter-dam region with an adhesive such that a maximum height of adhesive above the substrate top-surface exceeds the dam height. In step 1220, the adhesive may be applied via photolithography, stamping, a nanoimprint process, or any combination thereof. In an example of step 1220, inter-pad region 716 is filled with adhesive layer 1150, FIG. 11. Step 1220 may include step 1222, which includes covering the substrate-region and the conductive element with an adhesive. In an example of step 1222, inter-pad region 716 and redistribution layer 425 are covered by adhesive layer 1150, FIG. 11.

Figure 13:
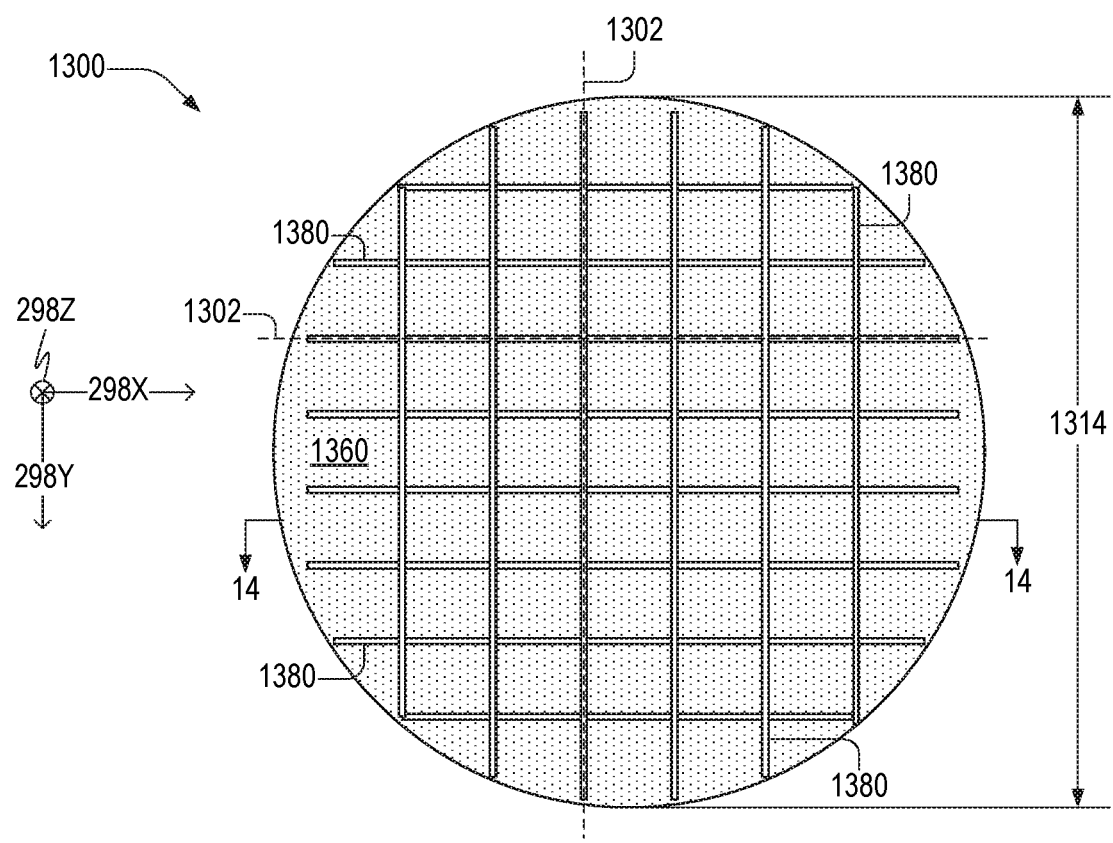
FIG. 13 is a cross-sectional view of a cover-glass assembly with a plurality of spacer elements thereon, in an embodiment.

FIG. 13 is a cross-sectional view of a cover-glass assembly 1300 in a plane parallel to the x-y plane. Cover-glass assembly 1300 includes a cover-glass wafer 1360 and a plurality of spacer elements 1380 attached thereto. Cover-glass wafer 1360 is an example of the cover-glass wafer of method 1200, step 1230, discussed above. Cover-glass wafer 1360 has a diameter 1314, which may equal diameter 614 of device wafer 600, FIG. 6. Cover-glass assembly 1300 may be aligned to device wafer 600 such that each spacer element 1380 aligns with a respective inter-device region 625 of device wafer 600. Cover-glass wafer 1360 has a bottom surface 1361. FIG. 13 illustrates dicing planes 1302, each of which may be orthogonal to bottom surface 1361. A dicing plane 1302 may intersect a spacer element 1380.

Spacer elements 1380 may be components of a monolithic spacer element that forms a grid pattern. A spacer element 1380 may include at least one material selected from the group of materials including, but not limited to tungsten, molybdenum, a photoresist material, and any combination thereof.

Figure 14:
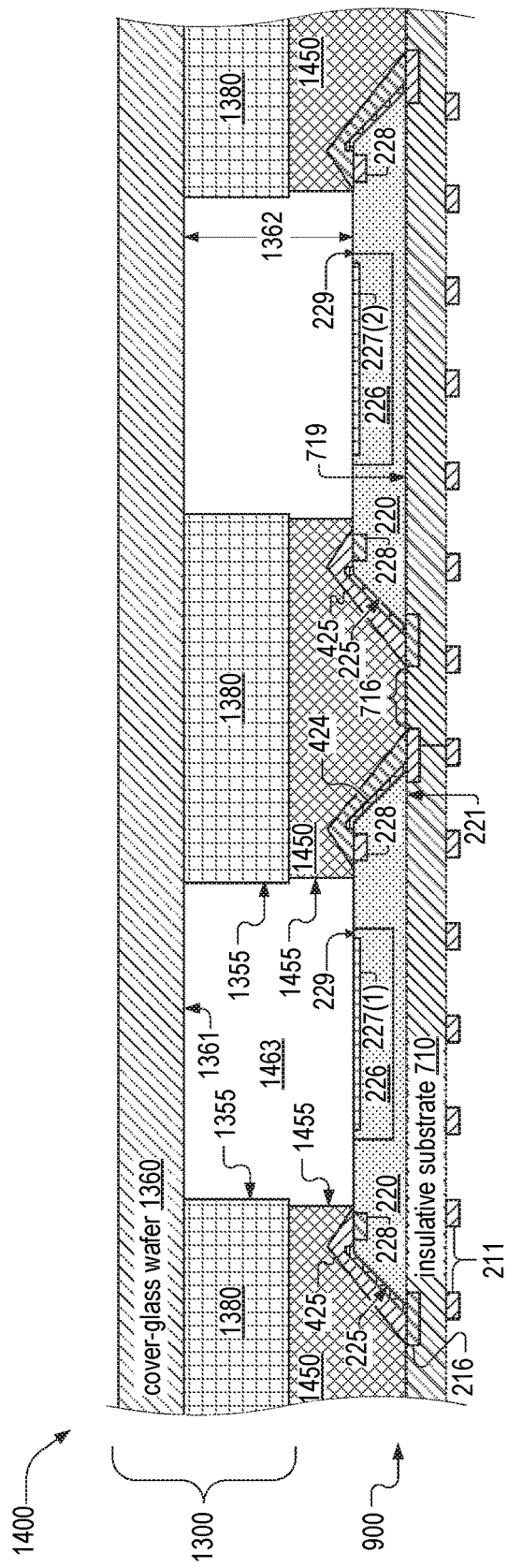
FIG. 14 is a cross-sectional view of an encapsulated device wafer, which includes the cover-glass assembly of FIG. 13 and the wafer assembly of FIG. 9, in an embodiment.

FIG. 14 is a schematic cross-sectional view of an encapsulated device wafer 1400. The cross-sectional view of FIG. 14 is, for example, in cross-sectional plane 14 of FIG. 13. Encapsulated device wafer 1400 includes cover-glass assembly 1300 attached to wafer assembly 900 via an adhesive layer 1450. Candidate materials for adhesive layer 1450 are the same as those for adhesive layer 250, FIG. 2. Semiconductor substrate 220, spacer elements 1380, cover-glass wafer 1360, and adhesive 1450 may form a cavity 1463 above image sensor 226. The cavity may be bounded by top surface 229 of semiconductor substrate 220, a side surface 1455 of adhesive layer 1450, a side surface 1355 of spacer elements 1380, and bottom surface 1361 of cover-glass wafer 1360. The cavity may have a minimum height corresponding to a minimum distance 1362 between bottom surface 1361 and top surface 229. Minimum distance 1362 may be equal minimum distance 462, FIG. 4.

Figure 15:
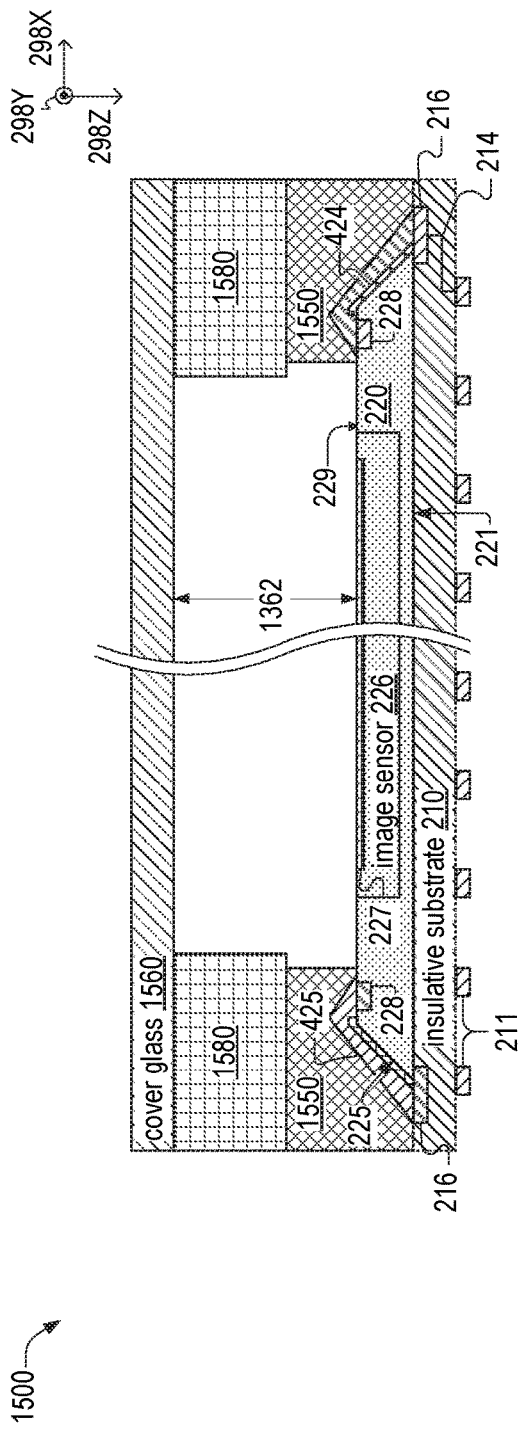
FIG. 15 is a schematic cross-sectional view of a third image-sensor chip-scale package, which is an embodiment of image-sensor package of FIG. 1.

FIG. 15 is a schematic cross-sectional view of a CSP 1500, which may result from singulating encapsulated device wafer 1400 along dicing planes 1302, FIG. 13. CSP 1500 includes insulative substrate 210, semiconductor substrate 220, adhesive layer 1550, a spacer layer 1580, and a cover glass 1560. Adhesive layer 1550, a spacer layer 1580, and a cover glass 1560 correspond to, respectively, adhesive layer 1450, spacer elements 1380, and cover-glass wafer 1360 of encapsulated device wafer 1400.

Figure 16:
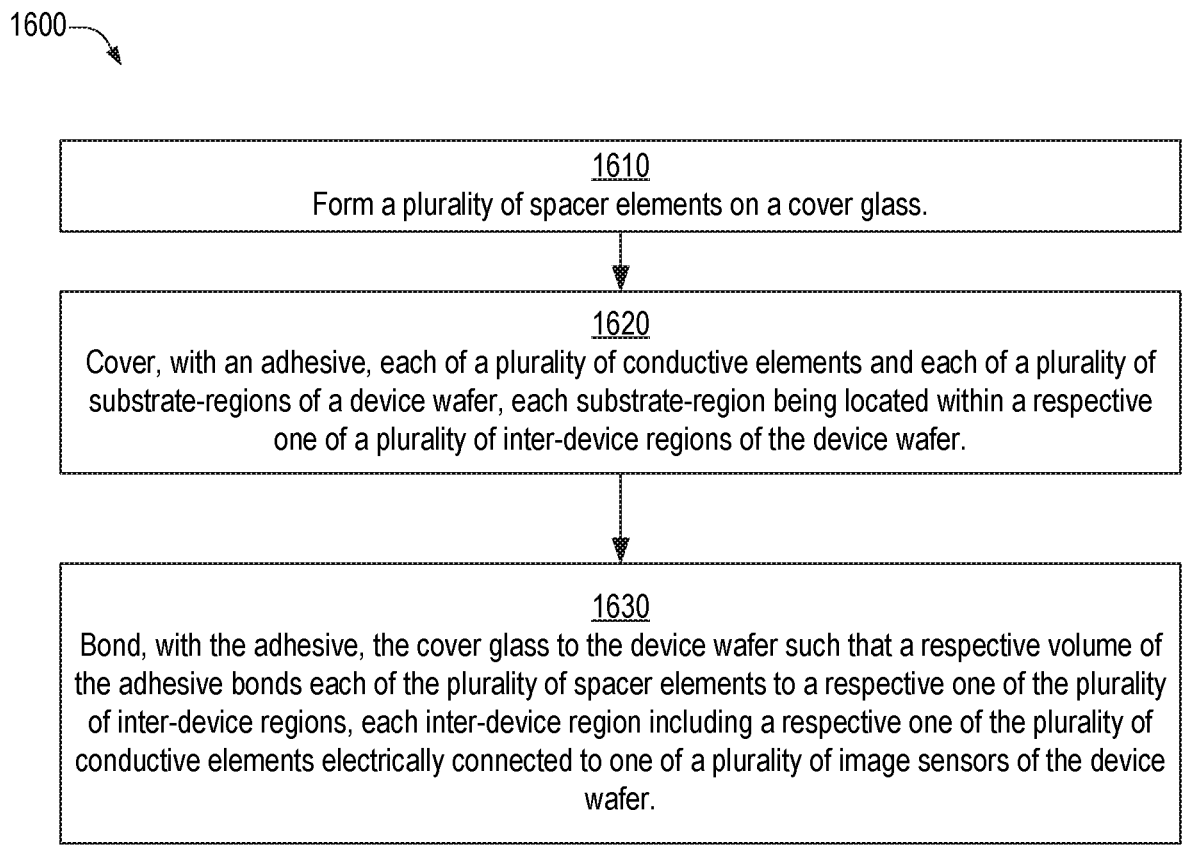
FIG. 16 is a flowchart illustrating a method for fabricating the image sensor chip-scale package of FIG. 15, in an embodiment.

FIG. 16 is a flowchart illustrating a method 1600 for fabricating an image sensor chip-scale package. Method 1600 includes at least one of steps 1610, 1620, and 1630.

Step 1630 includes bonding, with an adhesive, a cover glass to a device wafer. The cover glass includes a plurality of spacer elements attached thereto. The device wafer includes a plurality of image sensors and a plurality of inter-device regions. A respective volume of the adhesive bonds each of the plurality of spacer elements to a respective one of the plurality of inter-device regions. Each inter-device region including a respective one of a plurality of conductive elements electrically connected to one of a plurality of image sensors of the device wafer. Each of the inter-device regions, may be between a pair of adjacent ones of the image sensors. In an example of step 1620, cover-glass wafer 1360 is bonded to device wafer 600 to yield encapsulated device wafer 1400.

Step 1610 may be performed before step 1630, and includes forming the plurality of spacer elements on the cover glass. In an example of step 1610, spacer elements 1380 are formed on, or attached to, cover-glass wafer 1360.

Step 1620 may apply when the device wafer is mounted on an insulative substrate including a plurality of substrate-regions located within a respective one of the plurality of inter-device regions. Step 1620 includes covering, with the adhesive, each of the plurality of conductive elements and each of the plurality of substrate-regions. In an example of step 1620, redistribution layer 425 and substrate region 716 of wafer assembly 900 are covered with adhesive layer 1450.

Combinations of Features

Features described above as well as those claimed below may be combined in various ways without departing from the scope hereof. The following enumerated examples illustrate some possible, non-limiting combinations:

(A1) An image sensor chip-scale package (CSP) includes a pixel array, a cover glass covering the pixel array, a dam, and an adhesive layer. The pixel array is embedded in a substrate top-surface of a semiconductor substrate. The semiconductor substrate includes a plurality of conductive pads in a peripheral region of the semiconductor substrate surrounding the pixel array. The dam at least partially surrounds the pixel array and is located (i) between the cover glass and the semiconductor substrate, and (ii) on a region of the substrate top-surface between the pixel array and the plurality of conductive pads. The adhesive layer is (i) located between the cover glass and the semiconductor substrate, (ii) at least partially surrounding the dam, and (iii) configured to adhere the cover glass to the semiconductor substrate.

(A2) CSP (A1) may have a package top-surface that (i) is located above each of the pixel array, the dam, and the adhesive layer, (ii) includes at least part of a cover-glass top-surface of the cover glass, and (iii) has a height, relative to a bottom-surface of the cover glass opposite the cover-glass top-surface, that is uniform to within three micrometers.

(A3) In CSP (A2), the package top-surface may be the top-most surface of the image sensor chip-scale package.

(A4) Any CSP (A2) and (A3) may further include an opaque mask on the cover-glass top-surface and above at least one of the dam and the adhesive layer, the package top-surface including part of a top surface of the opaque mask.

(A5) In any CSP (A4), the opaque mask and the adhesive layer may be formed of different materials.

(A6) In any CSP (A1)-(A5), the adhesive layer may span between the substrate top-surface and the bottom-surface of the cover glass.

(A7) Any CSP (A1)-(A6) may further include a redistribution layer including a plurality of conductive segments each electrically connected to a respective one of the plurality of conductive pads and extending from the substrate top-surface toward a substrate bottom-surface of the semiconductor substrate opposite the substrate top-surface.

(A8) Any CSP (A7) may further include an isolation layer between a substrate side-surface and the redistribution layer, the substrate side-surface being between the substrate top-surface and a substrate bottom-surface thereopposite.

(A9) Any CSP (A1)-(A8) may also include an isolation layer on a substrate bottom-surface of the semiconductor substrate opposite the substrate top-surface. The insolation layer includes a plurality of conductive vias therethrough, each conductive via being electrically connected to the pixel array.

(A10) In any CSP (A1)-(A9), the adhesive layer may include at least one of a mercapto-ester, acrylic, an epoxy, polyimide, and polydimethylsiloxane.

(A11) In any CSP (A1)-(A10), the dam may include at least one of epoxy acrylate, an oligomer, polymethylacrylate, silica, polydimethylsiloxane, an epoxy resin, and silicon dioxide.

(B1) An image sensor chip-scale package (CSP) includes an insulative substrate, an image sensor, an integrated circuit, and a first redistribution layer. The insulative substrate includes a first plurality of conductive vias therethrough. The integrated circuit is located between the insulative substrate and the image sensor and has a top surface at a first height above a top surface of the insulative substrate. The first redistribution layer (i) electrically connects the integrated circuit to each of the first plurality of conductive vias, and (ii) spans a distance between the image sensor and the top surface of the insulative substrate; the distance exceeds the first height.

(B2) Any CSP (B1) may also include a second redistribution layer electrically connecting the image sensor to each of a second plurality of conductive vias through the insulative substrate.

(C1) A method for fabricating an image sensor chip-scale package includes bonding, with an adhesive, a cover glass to a semiconductor substrate. The adhesive occupies an inter-dam region surrounding a first pixel array embedded in a substrate top-surface of the semiconductor substrate. The inter-dam region is bounded at least in part by (i) a dam at least partially surrounding the first pixel array, (ii) a an adjacent dam least partially surrounding a respective pixel array adjacent to the first pixel array, and (iii) an inter-dam surface of the substrate top-surface.

(C2) Any method (C1), in which the dam and the adjacent dam each have a dam height above a substrate top-surface, may include filling the inter-dam region with the adhesive such that a maximum height of adhesive above the substrate top-surface exceeds the dam height.

(C3) Any method (C2), in which the semiconductor substrate is attached to an insulative substrate therebeneath, the inter-dam region including a conductive element electrically connected to the first pixel array, may also include (i) exposing a substrate-region, of the insulative substrate, located beneath the inter-dam surface; and, in the step of filling, (ii) covering the substrate-region and the conductive element with the adhesive.

(C4) In any method (C2), the step of exposing the substrate-region may include: (i) forming a trench through the inter-dam region, two opposing sidewalls of the semiconductor substrate defining a width of the trench; (ii) coating each of the two opposing sidewalls with an isolation layer; and (iii) disposing the conductive element on the isolation layer.

(D1) A method for fabricating an image sensor chip-scale package includes bonding, with an adhesive, a cover glass to a device wafer. The cover glass includes a plurality of spacer elements attached thereto. The device wafer includes a plurality of image sensors and a plurality of inter-device regions. A respective volume of the adhesive bonds each of the plurality of spacer elements to a respective one of the plurality of inter-device regions. Each inter-device region including a respective one of a plurality of conductive elements electrically connected to one of a plurality of image sensors of the device wafer. Each inter-device region, of the plurality of inter-device regions, may be between a pair of adjacent image sensors of the plurality of image sensors.

(D2) Any method (D1) may further include, before the step of bonding: forming the plurality of spacer elements on the cover glass.

(D3) Any method (D1) and (D2), in which the device wafer is mounted on an insulative substrate including a plurality of substrate-regions located within a respective one of the plurality of inter-device regions, may also include, before the step of bonding, covering, with the adhesive, each of the plurality of conductive elements and each of the plurality of substrate-regions.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present method and system, which, as a matter of language, might be said to fall therebetween.

What is claimed is:

1. An image sensor chip-scale package comprising:
   an insulative substrate including a first plurality of conductive pads;

a semiconductor substrate on the insulative substrate and including (i) a pixel array embedded in a substrate top-surface thereof and (ii) a second plurality of conductive pads in a peripheral region of the semiconductor substrate surrounding the pixel array;

a cover glass covering the pixel array and having a (i) cover-glass bottom-surface that includes a surface-region directly above the first plurality of conductive pads, (ii) a cover-glass top-surface opposite the cover-glass bottom surface, and (iii) a sloped side-surface spanning between the cover-glass bottom-surface and the cover-glass top-surface;

a dam at least partially surrounding the pixel array and located (i) between the cover glass and the semiconductor substrate, and (ii) on a region of the substrate top-surface between the pixel array and the second plurality of conductive pads;

an adhesive layer (i) located between the cover glass and the semiconductor substrate, (ii) at least partially surrounding the dam, (iii) configured to adhere the cover glass to the semiconductor substrate, and (iv) spanning between the first plurality of conductive pads and the surface-region; and an opaque mask on both (i) a first region of the cover-glass top-surface located above the dam and (ii) the sloped side-surface.

2. The image sensor chip-scale package of claim 1, having a package top-surface that (i) is located above each of the pixel array, the dam, and the adhesive layer, (ii) includes at least part of the cover-glass top-surface, and (iii) has a height, relative to the cover-glass bottom-surface, that is uniform to within three micrometers.

3. The image sensor chip-scale package of claim 2, the package top-surface being the top-most surface of the image sensor chip-scale package.

4. The image sensor chip-scale package of claim 1, the opaque mask also being on a second region of the cover-glass top-surface above the adhesive layer.

5. The image sensor chip-scale package of claim 4, the opaque mask and the adhesive layer being formed of different materials.

6. The image sensor chip-scale package of claim 1, the adhesive layer spanning between the substrate top-surface and the cover-glass bottom-surface.

7. The image sensor chip-scale package of claim 1, further comprising:

a redistribution layer including a plurality of conductive segments each electrically connected to a respective one of the second plurality of conductive pads and extending from the substrate top-surface toward a substrate bottom-surface of the semiconductor substrate opposite the substrate top-surface.

8. The image sensor chip-scale package of claim 7, further comprising an isolation layer between a substrate side-surface and the redistribution layer, the substrate side-surface being between the substrate top-surface and a substrate bottom-surface thereopposite.

9. The image sensor chip-scale package of claim 1, the insulative substrate including a plurality of conductive vias therethrough, each conductive via being electrically connected to the pixel array.

10. The image sensor chip-scale package of claim 1, the adhesive layer including at least one of a mercapto-ester, acrylic, an epoxy, polyimide, and polydimethylsiloxane.

11. The image sensor chip-scale package of claim 1, the dam including at least one of epoxy acrylate, an oligomer, polymethylacrylate, silica, polydimethylsiloxane, an epoxy resin, and silicon dioxide.

* * * * *